United States Patent [19]

Samarov

[11] Patent Number: 5,039,825
[45] Date of Patent: Aug. 13, 1991

[54] CORRUGATED STRIP GASKET FOR AN ELECTRONIC ENCLOSURE JOINT TO REDUCE BOTH ELECTROMAGNETIC AND RADIO FREQUENCY RADIATION

[75] Inventor: Victor M. Samarov, Carlisle, Mass.

[73] Assignee: Digital Equipment Corporation, Maynard, Mass.

[21] Appl. No.: 363,686

[22] Filed: Jun. 9, 1989

[51] Int. Cl.$^5$ ............................................. H05K 9/00
[52] U.S. Cl. ............................... 174/35 GC; 174/35 R
[58] Field of Search .......... 174/35 GC, 35 MS, 35 R; 361/399, 424; 219/10.55 R, 10.55 D; 277/227, 235 R, 325 A, 235 B, 901

[56] References Cited

U.S. PATENT DOCUMENTS

| | | |
|---|---|---|
| 805,645 | 11/1905 | Guillott . |
| 2,405,987 | 8/1946 | Arnold . |
| 2,773,459 | 12/1956 | Sechy . |
| 3,304,360 | 2/1967 | Hadley et al. .................. 174/35 GC |
| 3,332,566 | 7/1967 | Phillips . |
| 3,885,084 | 5/1975 | Kaisersuerth et al. ......... 174/35 MS |
| 4,554,400 | 11/1985 | Schmalzl . |
| 4,564,722 | 1/1986 | Nordin . |
| 4,567,317 | 1/1986 | Ehrlich et al. .................. 174/35 MS |
| 4,681,712 | 7/1987 | Sakakibara et al. ............ 174/35 MS |
| 4,780,570 | 10/1988 | Chuck . |
| 4,788,381 | 11/1988 | Nilsson . |
| 4,831,210 | 5/1989 | Larson et al. .................. 174/35 MS |

FOREIGN PATENT DOCUMENTS 0275171 7/1988 European Pat. Off. ........ 174/35 GC
3209349 9/1983 Fed. Rep. of Germany ........ 174/35 GC

OTHER PUBLICATIONS

H. Hugo Buchter, Industrial Sealing Technology 1979, pp. 44-47.
Mario Di Giovanni, Flat and Corrugated Diaphragm Design Handbook, 1982, pp. 29-31, 252 & 253.

Primary Examiner—Leo P. Picard
Assistant Examiner—Bot Lee Ledynh
Attorney, Agent, or Firm—Kenyon & Kenyon

[57] ABSTRACT

An arrangement to provide an electronic enclosure joint that reduces both electromagnetic and radio frequency radiation between walls of an enclosure of an electronics product has a corrugated metal strip serving as a gasket. The walls of the enclosure have inner conductive surfaces which contact the apices of the corrugated strip. The walls form a channel for the corrugated strip, with the inner conductive surfaces being kept a pre-determined distance apart. The force exerted by the corrugated strip provides electrical continuity between the inner conductive surfaces, while plastic deformation of the strip is avoided by maintenance of the pre-determined distance between the inner conductive surfaces. Because of the relatively low force needed to ensure electrical continuity, creep-prone materials such as plastic can be used for the walls, without the need for an excessive amount of fasteners to hold the walls together against the force exerted by the corrugated strip.

12 Claims, 1 Drawing Sheet

CORRUGATED STRIP GASKET FOR AN ELECTRONIC ENCLOSURE JOINT TO REDUCE BOTH ELECTROMAGNETIC AND RADIO FREQUENCY RADIATION

FIELD OF THE INVENTION

The invention relates to enclosures for electronics products. More particularly, the invention relates to an enclosure joint between two parts of an electronic enclosure such as a computer that acts to reduce both electromagnetic and radio frequency radiation.

BACKGROUND OF THE INVENTION

It is well known that certain electronic products, such as computers, are sources of electromagnetic interference (EMI) and radio frequency interference (RFI). This troublesome interference can disturb the operation of nearby electronic equipment such as radios, televisions and sensitive analog circuitry. As a result, there are strict federal and international standards imposed on the amount of conducted and radiated EMI and RFI that is permitted in commercial products. There is therefore a need to provide enclosures for electronics products that prevent EMI and RFI from being conducted or radiated outside of the enclosure.

It has been found that no matter how mechanically tight a joint is made between two surfaces of an enclosure, EMI and RFI can take place unless there is electrical continuity between the two surfaces. In order to provide the required electrical continuity in the joint, conductive elastomer gaskets, flexible metal strips and the like are frequently used. The gaskets or strips are sandwiched between the two surfaces and provide electrical continuity between the surfaces of the enclosure. A Faraday cage surrounding the electronics product is thereby formed by the enclosure, preventing EMI and RFI outside of the enclosure.

When installed properly, elastomer gaskets and the like perform well and satisfy stringent military requirements. A problem with these gaskets, however, is that they cause the force needed to assemble the enclosure, (the closure force), to be relatively very high. This high closure force necessitates the use of a relatively large number of fasteners to hold the two surfaces of the joint together. The assembly cost and time needed to enclose a product increases greatly with the use of a large number of mechanical fasteners. Furthermore, the cost of these gaskets themselves is relatively very high.

The high closure force of the conductive elastomer gaskets and the like also makes these gaskets unsuitable for use with creep-prone materials, such as plastic. Instead, they are better suited for use with metal enclosures. With certain plastic materials, however, which are now being used for computer enclosures more frequently, the surfaces tend to move and thus in time to creep apart when a force is applied against the surface of the plastic. Electrical continuity in time can therefore no longer be assured between the surfaces of certain plastic enclosures.

A need exists for an arrangement to provide an EMI and RFI-tight joint between surfaces of an enclosure that requires a relatively low closure force. This would allow the enclosure to be made of plastic and other creep-prone materials and reduce the assembly costs of the enclosure.

SUMMARY OF THE INVENTION

The present invention provides an EMI and RFI-tight joint between two walls of an enclosure for an electronics product. Each of the walls has an inner conductive surface, these two surfaces being electrically coupled together by a corrugated strip. The walls of the enclosure and the corrugated strip are arranged so that the force exerted by the strip acts in the direction of the planes of the walls, thus offering the greatest stiffness to react to assembly forces. The corrugated strip provides electrical continuity between the surfaces of the walls of the enclosure to meet FCC regulations. The satisfaction of these regulations is adequate for most commercial products.

The low closure force required by the corrugated strip eliminates the need for multiple fasteners to hold the two walls together and prevent creeping of the walls. This greatly reduces the assembly cost of the enclosure.

When the corrugated strip is made of stainless steel, for example, the strip is relatively inexpensive and is not heat-or creep-sensitive.

DETAILED DESCRIPTION

Figure 1:
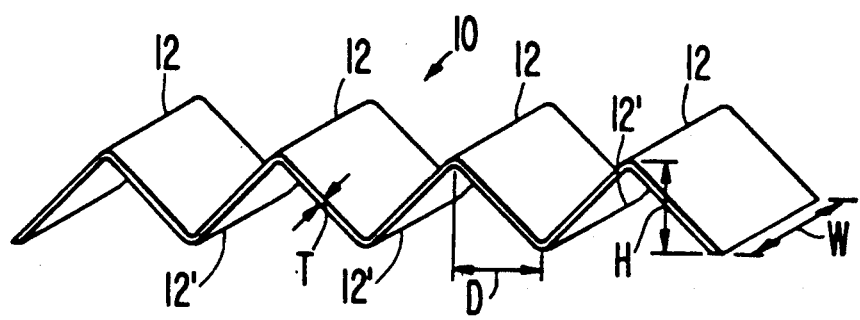
FIG. 1 is a perspective view of a corrugated strip constructed in accordance with an embodiment of the present invention.

An embodiment of the corrugated strip of the present invention is shown in FIG. 1. The strip 10 is corrugated such that a number of apexes or apices 12 are formed. The strip 10 is formed of a material that has a negligible compression set over the life of the product. One example of such a material is stainless steel.

Figure 2:
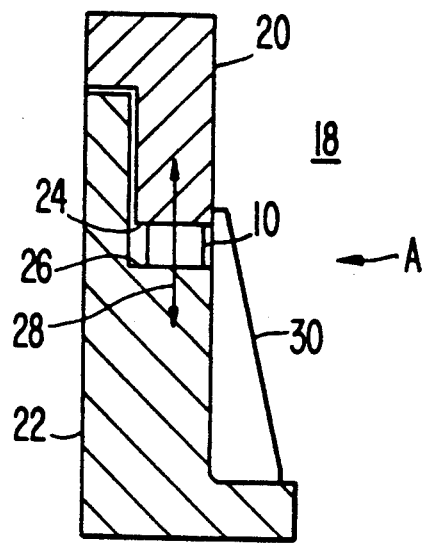
FIG. 2 is a cross-sectional view of a portion of an enclosure constructed in accordance with an embodiment of the present invention.
Figure 3:
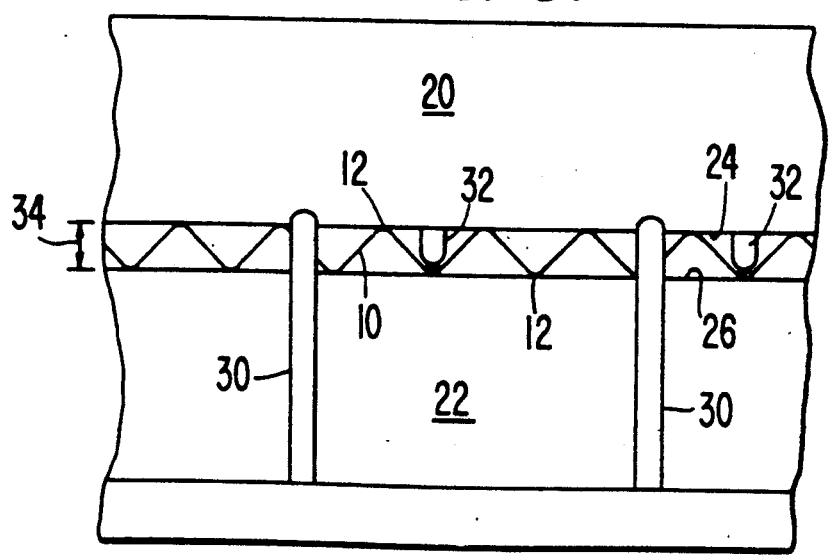
FIG. 3 is a view of the embodiment of FIG. 2 in the direction of arrow A.

FIGS. 2 and 3 show the corrugated strip 10 in an assembled enclosure 18, which could be an enclosure for computer equipment. The strip 10 is shown mounted between two walls 20,22 of the enclosure 18. In the illustrated embodiment, the walls 20,22 are made of a creep-prone material such as plastic.

The two walls 20,22 must be electrically coupled to one another in order to provide the EMI and RFI shielding for the enclosure 18. When the walls 20,22 are made of plastic, conductive layers must be provided on each of the walls 20,22 by any of a number of different methods, such as by plasma spraying, conductive paint, or electroplating. Accordingly, wall 20 has a conductive contact surface 24, while wall 22 also has a conductive contact surface 26.

The corrugated strip 10 acts electrically to couple the two walls 20,22 together. In order to do this, the corrugated strip 10 must remain in good contact with both of the conductive surfaces 24 and 26. During assembly, lateral movement of the strip 10 is prevented by ribs 30, which hold the strip 10 within the channel formed by the two walls 20,22. These ribs 30 can be made, for example, of plastic and extend integrally upwardly from the bottom of the enclosure.

In order to ensure a reliable electrical contact between the corrugated strip 10 and the conductive surface 24,26, the corrugated strip 10 should not be overly deformed. For this purpose, one of the walls 20,22 is provided with abutments 32 (as shown in FIG. 3) that maintain a distance 34 between the upper and lower walls 20,22. In this way, the corrugated strip 10 will not be deformed beyond a predetermined amount. Other means for maintaining a predetermined distance between the conductive surfaces 24,26 can be used, such as a tongue-in-groove construction of the walls 20,22, where the tongue extends only partially into the groove of the other wall.

Referring back to FIG. 1, a typical example of the geometry of the strip can be 0.125 inches wide (W), the strip thickness T can be 0.003 inches, the free height H can be 0.100 inches. The assembled height of the strip 10 when placed between the two walls 20,22 is 0.050 inches. When the strip 10 is a stainless steel strip, these dimensions provide a contact force F of approximately 0.011 pounds, and a contact pressure of approximately 29 psi. This is adequate to ensure electrical continuity between the conductive surfaces 24,26. Furthermore, the stress level in the strip in the assembled joint is approximately 17,000 psi, considerably below the level of plastic deformation of steel.

The lateral distance D between an upper apex 12 and a lower apex 12' of the strip 10 is, for example, 0.60 inches. This is known as the pitch. It has been found that FCC shielding regulations are met with the corrugated strip 10 when a pitch of 0.60 is used. However, the effect of RFI shielding is further increased by having lower pitches, for example, 0.30 inches. It should be apparent to one of ordinary skill in the art that different dimensions for the corrugated strip 10 can be used without departing from the scope of the invention.

The amount of force needed to join the two walls 20,22 together is greatly reduced by the use of the corrugated strip 10 of the present invention. The reduction in assembly force provides the advantage that a large number of fasteners, such as screws, do not need to be used to hold the enclosures 20,22 together against the force of the corrugated strip 10 even though the enclosure is plastic. Instead, simple snap-fitting plastic tabs formed with the walls 20,22 can be used. Thus, assembly time and labor is greatly reduced by using a snap-fit enclosure allowed by the lower closure force of the corrugated strip.

The arrangement of the present invention is particularly suited for use with creep-prone materials, such as plastic, since the force exerted by the corrugated strip 10 acts in a direction 28 (see FIG. 2) that is in the plane of the walls 20,22. These walls 20,22 offer their maximum flexural stiffness to resist the phenomenon of creep in the direction 28. In other words, the walls 20,22 will not tend to be pushed away from each other in direction 28 over time to such an extent that electrical contact will be reduced. This is an improvement over an arrangement in which the walls overlap each other with a gasket between, because in this arrangement, the walls tend to be pushed away from each other.

The present invention provides an inexpensive strip acting as an EMI-RFI shielding gasket that allows the use of creep-prone materials such as plastic in an enclosure for electronics products, since the strip of the invention only requires a low closure force.

Although an exemplary embodiment has been illustrated and described in detail, the invention is not limited to this embodiment but only by the terms of the appended claims.

What is claimed is:

1. An arrangement that provides an electronic enclosure joint between walls of an enclosure to reduce electromagnetic and radio frequency radiation, comprising:
   two walls, each of said walls having at least one conductive surface, wherein said walls are made of a creep-prone plastic material; and
   a conductive corrugated strip having a plurality of apices, said strip being located between said conductive surfaces of said walls such that at least one apex of said strip contacts one of said conductive surfaces and another apex of said strip contacts said other conductive surface to thereby establish electrical continuity between said conductive surfaces;
   wherein a compression of said strip between said walls results in said strip exerting a force on said walls that maintains contact of said apices to said conductive surfaces.

2. The arrangement of claim 1, wherein said conductive surfaces are formed by plasma spray.

3. The arrangement of claim 1, wherein the conductive surfaces are conductive paint.

4. The arrangement of claim 1, wherein the conductive surfaces are formed by electroplating.

5. The shielding gasket of claim 1, wherein the strip is made of a heat-insensitive and creep-insensitive material.

6. The shielding gasket of claim 5, wherein the strip is made of stainless steel.

7. The shielding gasket of claim 1, wherein the strip provides a contact force of approximately 0.011 pounds and a contact pressure of approximately 29 psi.

8. An arrangement that provides an electronic enclosure joint between walls of an enclosure to reduce electromagnetic and radio frequency radiation, comprising:
   two walls, each of said wall having at least one conductive surface;
   a conductive corrugated strip having a plurality of apices, said strip being located between said conductive surfaces of said walls such that at least one apex of said strip contracts one of said conductive surfaces and another apex of said strip contacts said other conductive surface to thereby establish electrical continuity between said conductive surfaces; and
   means for maintaining a pre-determined minimum distance between said conductive surfaces wherein deformation of said strip is maintained within a predetermined range,
   wherein a compression of said strip between said walls results in said strip exerting a force on said walls that maintains contact of said apices to said conductive surfaces.

9. The arrangement of claim 8, wherein said means for maintaining a pre-determined minimum distance comprises at least one abutment coupled to at least one of said walls.

10. An arrangement that provides an electronic enclosure joint between walls of an enclosure to reduce electromagnetic and radio frequency radiation, comprising:
   two walls, each of said walls having at least one conductive surface; and
   a conductive, stainless steel corrugated strip having a plurality of apices, said strip being located between said conductive surfaces of said walls such that at least one apex of said strip contracts one of said conductive surfaces and another apex of said strip contacts said other conductive surface to thereby establish electrical continuity between said conductive surfaces;

wherein a compression of said strip between said walls results in said strip exerting a force on said walls that maintains contact of said apices to said conductive surfaces.

11. A shielding gasket for preventing electromagnetic and radio frequency interference in an enclosure, the enclosure having first and second enclosure walls, each of the wall having a conductive surface, comprising an electrically conductive strip with a plurality of alternately facing apexes spaced at a predetermined distance therealong, wherein the predetermined distance between alternately facing apexes is 0.60 inches, at least one of said apex contacting the conductive surface of the second enclosure wall when said strip is positioned between the first and second enclosure walls, wherein said strip, when compressed between the first and second enclosure walls, exerts a force against each of the walls to maintain electrical contact with the walls.

12. A shielding gasket for preventing electromagnetic and radio frequency interference in an enclosure, the enclosure having first and second enclosure walls, each of the walls having a conductive surface, comprising an electrically conductive strip with a plurality of alternately facing apexes spaced at a predetermined distance therealong, wherein the predetermined distance between alternately facing apexes is 0.30 inches, at least one of said apexes contacting the conductive surface of the second enclosure wall when said strip is positioned between the first and second enclosure walls, wherein said strip, when compressed between the first and second enclosure walls, exerts a force against each of the walls to maintain electrical contact with the walls.

* * * * *